United States Patent [19]

Kawano et al.

[11] Patent Number: 4,818,952
[45] Date of Patent: Apr. 4, 1989

[54] OSCILLATION CIRCUIT

[75] Inventors: Mitsumo Kawano, Honjo; Tadashi Terada, Fukaya, both of Japan

[73] Assignee: Kabushiki Kaisha Toshiba, Kanagawa, Japan

[21] Appl. No.: 151,585

[22] Filed: Feb. 2, 1988

[30] Foreign Application Priority Data

Feb. 4, 1987 [JP] Japan .................................. 62-23984

[51] Int. Cl.⁴ ............................................. H03B 5/24
[52] U.S. Cl. ............................. 331/108 R; 331/177 R
[58] Field of Search ................. 331/34, 108 R, 108 B, 331/108 C, 117 K, 116 R, 177 R

[56] References Cited

U.S. PATENT DOCUMENTS

| 3,699,476 | 10/1972 | Mancini | 331/116 R |
| 3,728,641 | 4/1973 | Fujita et al. | 331/116 R |
| 4,064,468 | 12/1977 | Kumata | 331/116 R |
| 4,492,934 | 1/1985 | Sugimoto | 331/177 R X |
| 4,574,257 | 3/1986 | Kasperkovitz et al. | 331/117 R X |

FOREIGN PATENT DOCUMENTS

| 0066334 | 12/1982 | European Pat. Off. |
| 0163803 | 12/1985 | European Pat. Off. |
| 1486220 | 9/1977 | United Kingdom |
| 2132439 | 7/1984 | United Kingdom |

Primary Examiner—David Mis
Attorney, Agent, or Firm—Finnegan, Henderson, Farabow, Garrett, & Dunner

[57] ABSTRACT

An oscillation circuit for an integrated circuit device. The oscillation circuit includes a band-pass filter for producing an output signal having a voltage and a defined resonance frequency and a voltage to current converter type limiter amplifier connected to the band-pass filter for supplying a current to the band-pass filter corresponding to the voltage of the output signal of the band-pass filter.

2 Claims, 3 Drawing Sheets

OSCILLATION CIRCUIT

FIELD OF THE INVENTION

The present invention relates generally to an oscillation circuit, and more particularly, to an oscillation circuit using a band-pass filter.

BACKGROUND OF THE INVENTION

Conventionally, oscillation circuits typically utilize an LC oscillator comprised of an inductor and a capacitor producing an inductance L and a capacitance C, respectively. The LC oscillator has a good stability and a relatively good S/N (signal to noise) ratio. However, the LC oscillator generally is unsuitable for an oscillation circuit intended to be fabricated on an IC (integrated circuit). This is because inductors are difficult to form on ICs.

Recently, new oscillation circuits, which are suitable for fabrication in ICs, were invented by one of the same inventors. The prior invention is now pending as Japanese Patent Application No. 61-172244 which was filed on July 22, 1986, and was filed in the U.S. on July 15, 1987 and assigned Ser. No. 07/074,294. The oscillation circuit according to the prior invention has been constructed by using band-pass filters. FIG. 1 shows an example of such a oscillation circuit using band-pass filters.

Referring now to FIG. 1, the oscillation circuit using band-pass filters according to the prior invention will be described. In FIG. 1, the oscillation circuit is comprised of a band-pass filter 10 and a limiter amplifier 12. An output terminal 10a of the band-pass filter 10 is coupled to its input terminal 10b through the limiter amplifier 12. Thus, the oscillation circuit forms a loop circuit consisting of the band-pass filter 10 and the limiter amplifier 12.

The band-pass filter 10 includes a pair of integration circuits 14 and 16. Each of the integration circuits 14 and 16 includes a voltage to current conversion circuit (referred as V/C converter hereafter) 18 and 20 respectively and a capacitor 22 and 24 respectively. Thus, each of the integration circuits 14 and 16 has a prescribed time constant defined by the conductance of the V/C converter and the capacitance of the capacitor. The V/C converters 18, 20 are constructed in a differential amplifier configuration.

The non-inverted input terminal 18a of the first V/C converter 18 is coupled to a DC voltage source 26 with a prescribed DC voltage. The output terminal 18b of the first V/C converter 18 is coupled to one end of the first capacitor 22 and the noninverted input terminal 20a of the second V/C converter 20. The output terminal 20b of the second V/C converter 20 is coupled to one end of the second capacitor 24 and the inverted input terminals 18c and 20c of the first and second V/C converters 18 and 20.

The inverted input terminal 18c of the first V/C converter 18 is directly coupled to the output terminal 20b of the second V/C converter 20. While the inverted input terminal 20c of the second V/C converter 20 is coupled to the output terminal 20b of the second V/C converter 20 through a voltage divider 28.

The output terminal 20b of the second V/C converter 20 is also coupled to the input terminal 12a of the limiter amplifier 12 through the output terminal 10a of the band-pass filter 10. The output terminal 12b of the limiter amplifier 12 is coupled to the other end of the first capacitor 22 through the input terminal 10b of the band-pass filter 10. By the way, the other end of the second capacitor 24 is grounded.

In the oscillation circuit, the output Va of the band-pass filter 10 on the output terminal 10a is fed back to the input terminal 10b through the limiter amplifier 12 in a positive phase relation. The transfer characteristics Tf of the band-pass filter 10 is expressed by the following equation:

$$\frac{Va}{Vb} = \frac{\frac{gm20}{C20} \cdot S}{S^2 + m \cdot \frac{gm20}{C24} \cdot S + \frac{gm18 \cdot gm20}{C22 \cdot C24}} \quad (1)$$

where,
gm18 is the conductance of the first V/C converter 18;
gm20 is the conductance of the second V/C converter 20;
m is the voltage dividing ratio of the voltage divider 28 (m<1);
C22 is the capacitance of the first capacitor 22; and
C24 is the capacitance of the second capacitor 24.
Now, assuming that:

$$\frac{gm18}{C22} = \omega_1, \frac{gm20}{C24} = \omega_2 \quad (2)$$

where $\omega$ represents an angular frequency, the Equation (1) is expressed as follows:

$$\frac{Va}{Vb} = \frac{\omega_2 \cdot S}{S^2 + m \cdot \omega_2 \cdot S + \omega_1 \cdot \omega_2} \quad (3)$$

When it is assumed that $\omega_1 = \omega_2 = \omega_0$, the Equation (3) becomes as follows:

$$\frac{Va}{Vb} = \frac{\omega_0 \cdot S}{S^2 + m \cdot \omega_0 \cdot S + \omega_0} \quad (3)$$

The transfer characteristic Tf of the band-pass filter 10, given by the Equation (4), has the frequency characteristics shown in FIG. 2, in which the graphs 2(A) and 2(B) show the frequency characteristics in regard to an absolute level La and a phase angle Ap of the transfer characteristics Tf.

When the output Va of the band-pass filter 10 having these characteristics is fed back to the input terminal 10b of the band-pass filter 10 in the positive phase relation through the limiter amplifier 12, oscillation takes place at the angular frequency $\omega_0$ as a resonance angular frequency. The resonance angular frequency $\omega_0$ varies in accordance with the conductances gm18 and gm20. Thus, the oscillation circuit can be operated as a voltage controlled oscillator by controlling the conductances gm18 and gm20.

In the oscillation circuit, as shown in FIG. 1, the input Vb fed back through the limiter amplifier 12 has been given by the voltage configuration. The limiter amplifier 12 generally includes an emitter follower type buffer (not shown) for supplying the input Vb of the voltage configuration. As is well known, emitter follower type buffers need a relatively large amount of current to operate. However, it is difficult to flow large currents in ICs, because ICs have become too large in scale for flowing a relatively large current.

If the emitter follower type buffer in the limiter amplifier 12 is driven by a relatively small current, the limiter amplifier 12 fails to supply the band-pass filter 10 with the input Vb in a stable state. Thus, the oscillation signal obtained by the oscillation circuit can be distorted. Further, an insufficient current for the emitter follower type buffer of the limiter amplifier 12 causes a phase delay in the oscillation signal. The phase delay may cause a shift of the oscillation frequency from a desired resonance frequency, i.e., the prescribed angular frequency $\omega 0$.

To avoid this problem, a push-pull type buffer may be considered for use in the band-pass filter 10 in place of the emitter follower type buffer. However, in this configuration the limiter amplifiers becomes more complicated occurs and more space is needed in the IC.

As described above in detail, in the oscillation circuit using band-pass filters according to the prior onvention, the oscillation frequency may shift from a desired resonance frequency if the band-pass filter is driven by a small current. On the other hand, a limiter amplifier for driving the band-pass filter becomes too large in scale and complicated in structure when a push-pull type buffer is used in the limiter amplifier for driving the band-pass filter.

SUMMARY OF THE INVENTION

It is, therefore, an object of the present invention to provide an oscillation circuit which is more suitable for fabrication in ICs, and which does not occupy an inordinate space.

Another object of the present invention is to provide an oscillation circuit which is simple in structure and capable of driving a band-pass filter satisfactorily without causing an undesired shift of the oscillation frequency from a prescribed resonance frequency.

In order to attain the above objects, the present invention converts the output of the band-pass filter into current signal and feeds it back to the band-pass filter.

In the circuit construction, the band-pass filter is driven by current, and shifts of the oscillation frequency caused by a phase delay resulting from distortion of the signal can be reduced while avoiding undesired complication of the circuits.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
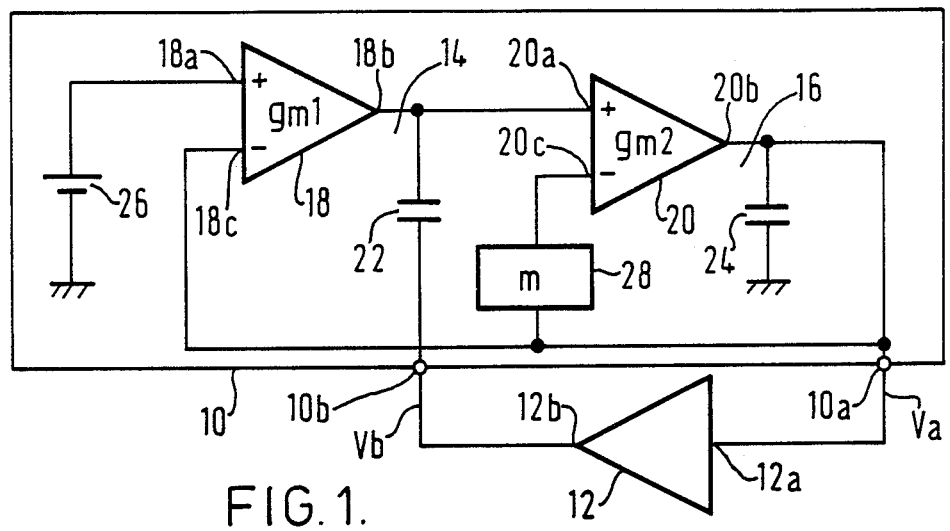
FIG. 1 is a circuit diagram which shows the structure of an oscillation circuit according to a prior invention.

The present invention will be described in detail with reference to the FIGS. 3 through 5. Throughout the drawings, reference numerals or letters used in FIG. 1 will be used to designate like or equivalent elements for simplicity of explanation.

Figure 3:
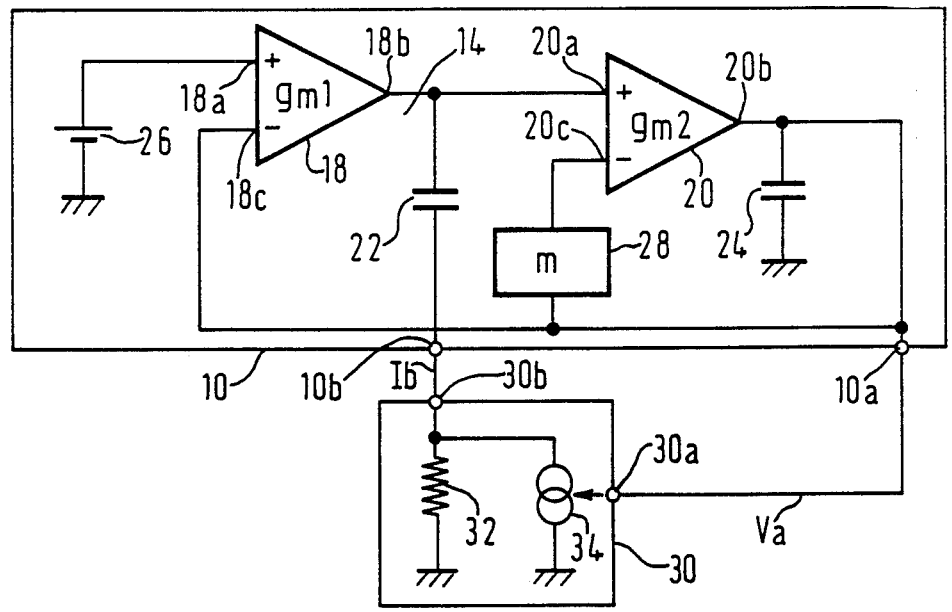
FIG. 3 is a circuit diagram which shows the structure of one embodiment of the present invention.

Referring now to FIG. 3, a first embodiment of the oscillation circuit using band-pass filters according to the present invention will be described in detail. In FIG. 3, the first embodiment of the oscillation circuit is comprised of a band-pass filter 10 and a V/C converter type limiter amplifier 30. An output terminal 10a of the band-pass filter 10 is coupled to its input terminal 10b through the V/C converter type limiter amplifier 30. Thus, the oscillation circuit forms a loop circuit consisting of the band-pass filter 10 and the V/C converter type limiter amplifier 30.

The band-pass filter 10 includes a pair of integration circuits 14 and 16. Each of the integration circuits 14, 16 includes a V/C converter 18, 20 and a capacitor 22, 24. Thus, each of the integration circuits 14, 16 has a prescribed time constant defined by the conductance of the V/C converter 18, 20 and the capacitance of the capacitor 22, 24. The V/C converters 18, 20 are constructed in a differential amplifier configuration.

The non-inverted input terminal 18a of the first V/C converter 18 is coupled to a DC voltage source 26 with a prescribed DC voltage. The output terminal 18b of the first V/C converter 18 is coupled to one end of the first capacitor 22 and the non-inverted input terminal 20a of the second V/C converter 20. The output terminal 20b of the second V/C converter 20 is coupled to one end of the second capacitor 24, the other end of which is grounded, and the inverted input terminals 18c and 20c of the first and second V/C converters 18 and 20.

The inverted input terminal 18c of the first V/C converter 18 is directly coupled to the output terminal 20b of the second V/C converter 20. While the inverted input terminal 20c of the second V/C converter 20 is coupled to the output terminal 20b of the second V/C converter 20 through a voltage divider 28.

The output terminal 20b of the second V/C converter 20 is also coupled to the input terminal 30a of the V/C converter type limiter amplifier 30 through the output terminal 10a of the band-pass filter 10. The output terminal 30b of the V/C converter type limiter amplifier 30 is coupled to the other end of the first capacitor 22 through the input terminal 10b of the band-pass filter 10.

The V/C converter type limiter amplifier 30 is comprised of a resistor 32 and a variable current source 34. The resistor 32 and the variable current source 34 are connected in parallel with each other and connected between the first capacitor 22 and a reference terminal such as a ground terminal.

The variable current source 34 is coupled to the output terminal 10a of the band-pass filter 10 so that the current $I_{34}$ of the variable current source 34 is controlled in response to an output Va of the band-pass filter 10. Thus, the variable current source 34 converts the voltage configuration output Va of the band-pass filter 10 into a current configuration input $I_{34}$ and feeds it to the input terminal 10b of the band-pass filter 10. Then, a voltage configuration input Vb on the input terminal 10b is expressed by the following equation:

$$Vb = R_{32} \cdot I_{34} \qquad (5)$$

where R32 is the resistance of the resistor 34.

Figure 4:
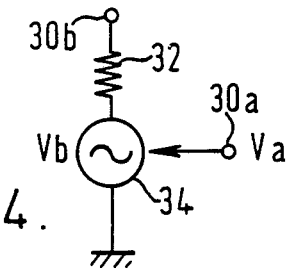
FIG. 4 is a partial equivalent circuit of the circuit shown in FIG. 3.

The V/C converter type limiter amplifier 30 is equivalent to the circuit shown in FIG. 4. Therefore, the transfer characteristic Tf of the band-pass filter 10 is expressed by the following equation:

$$\frac{Va}{Vb} = \frac{\frac{gm20}{C20} \cdot S}{S^2 + (m + R32 \cdot gm18) \cdot \frac{gm20}{C24} \cdot S + \frac{gm18 \cdot gm20}{C22 \cdot C24}} \quad (6)$$

where,
gm18 is the conductance of the first V/C converter 18;
gm20 is the conductance of the second V/C converter 20;
m is the voltage dividing ratio of the voltage divider 28 (m<1);
C22 is the capacitance of the first capacitor 22; and
C24 is the capacitance of the second capacitor 24.

Now, assuming that:

$$\frac{gm18}{C22} = \omega_1, \frac{gm20}{C24} = \omega_2 \quad (7)$$

the Equation (6) is expressed as follows:

$$\frac{Va}{Vb} = \frac{\omega_2 \cdot S}{S^2 + (m + R32 \cdot gm18) \cdot \omega_0 \cdot S + \omega_1 \cdot \omega_2} \quad (8)$$

When it is assumed that $\omega_1 = \omega_2 = \omega_0$, the Equation (8) becomes as follows:

$$\frac{Va}{Vb} = \frac{\omega_0 \cdot S}{S^2 + (m + R32 \cdot gm18) \cdot \omega_0 \cdot S + \omega_0^2} \quad (9)$$

Figure 2:
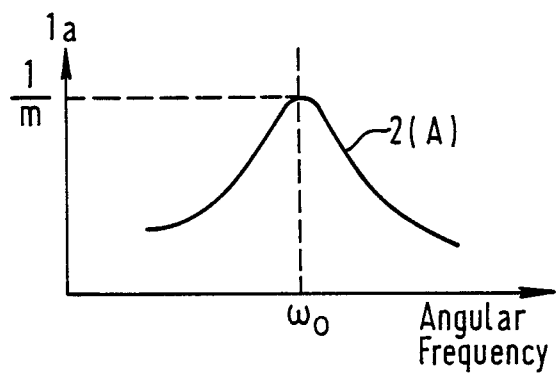
FIG. 2 is a graph diagrams which shows the characteristics of the band-pass filter shown in FIG. 1.
Figure 2:
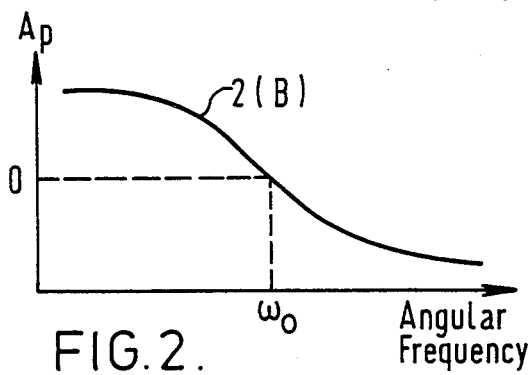

The transfer characteristics Tf of the band-pass filter 10, given by the Equation (9), has also the frequency characteristics, as shown in FIG. 2.

When the output Va of the band-pass filter 10 having these characteristics is fed back to the input terminal 10b of the band-pass filter 10 in the positive phase relation through the V/C converter type limiter amplifier 30, oscillation takes place at the angular frequency $\omega_0$ as a resonance angular frequency. In the resonance angular frequency $\omega_0$, a following relation is given:

$$S = j \cdot \omega_0 \quad (10)$$

Thus, the Equation (9) becomes as follows:

$$\frac{Va}{Vb} = \frac{1}{m + R32 \cdot gm18} \quad (11)$$

Now, assuming the voltage dividing ratio $m = 0$, a following relation is established:

$$\frac{Va}{Vb} = \frac{1}{R32 \cdot gm18} \quad (12)$$

The condition of the voltage dividing ratio $m=0$ can be realized by coupling the inverted input terminal 20c of the second V/C converter 20 to any reference potential source.

When substituting the input Vb of the Equation (5), the Equation (12) is expressed as follows:

$$Va = \frac{1}{R32 \cdot gm18} \cdot Vb = \frac{1}{gm18} \cdot Ib \quad (13)$$

As is understood from the Equation (13), the output Va of the band-pass filter 10, i.e., the oscillation output of the oscillation circuit according to the first embodiment becomes independent from the resistance $R_{32}$ of the resistor 32. Furthermore, there is no possibility for causing distortion because of current driving.

Figure 5:
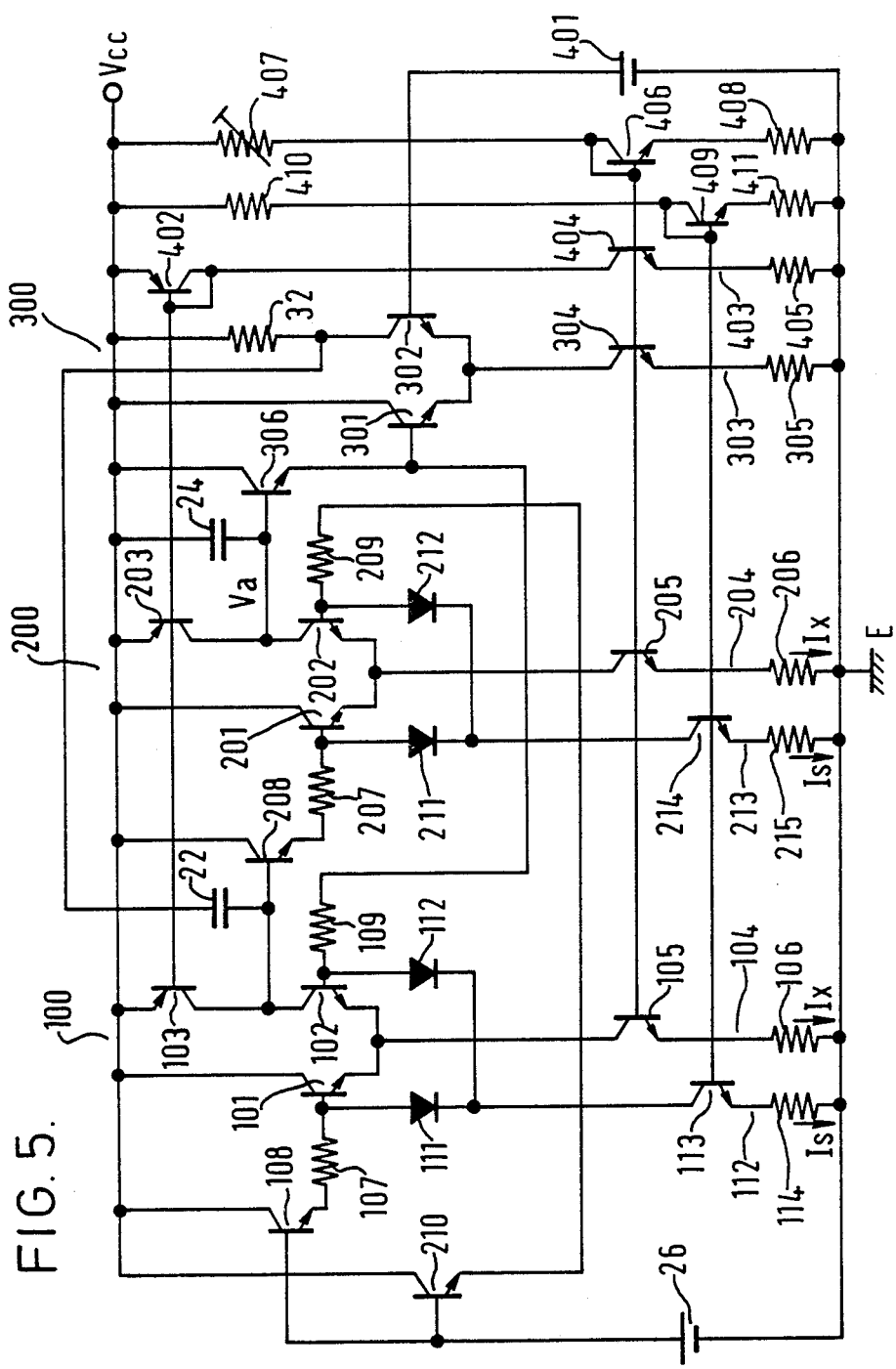
FIG. 5 is a circuit diagram which shows the detailed structure of the embodiment of the circuit shown in FIG. 3.

FIG. 5 is a circuit diagram showing a practical example of the oscillation circuit according to the present invention. The circuit shown in FIG. 5 is applied to a voltage controlled oscillator. In FIG. 5, the voltage controlled oscillator is comprised of three differential amplifiers 100, 200 and 300 and a pair of capacitors 22 and 24. First and second differential amplifiers 100, 200 correspond to the first and second V/C converters 18, 20 of the first embodiment. Third differential amplifier 300 corresponds to the V/C converter type limiter amplifier 30 of the first embodiment.

The first and second differential amplifiers 100, 200 are especially constructed in a Gilbert circuit configuration. The basic construction of Gilbert circuit type differential amplifiers is described in detail, for instance, in the U.S. Pat. Nos. 3,931,583, 4,075,574 and 4,156,283.

In the first differential amplifier 100, a pair of first and second transistors 101 and 102 are coupled to each other in a differential amplifier configuration. The collector of the first differential transistor 101 is directly coupled to a power supply terminal Vcc. The collector of the second differential transistor 102 is coupled to the power supply terminal Vcc through a transistor 103 forming an active load for the first differential amplifier 100. Their emitters are connected in common to each other and coupled to a ground terminal E through a first current source 104. The first current source 104 includes a transistor 105 and an emitter resistor 106 connected in series.

The base of the first differential transistor 101 is coupled to a DC voltage source 26 through a resistor 107 and a transistor 108. The base of the second differential transistor 102 is coupled to the third differential amplifier 300 through a resistor 109, as described later. The bases of the transistors 101, 102 are further coupled to to the ground terminal E through diodes 110 and 111, respectively, and a second current source 112, in common. The second current source 112 includes a transistor 113 and an emitter resistor 114 connected in series. The collector of the second transistor 102 is connected to a capacitor 22, as described later.

In the second differential amplifier 200, a pair of third and fourth transistors 201 and 202 are coupled to each other in a differential amplifier configuration. The collector of the third differential transistor 201 is directly coupled to a power supply terminal Vcc. The collector of the fourth differential transistor 202 is coupled to the power supply terminal Vcc through a transistor 203 forming an active load for the second differential amplifier 200. Their emitters are connected in common to each other and coupled to the ground terminal E through a third current source 204. The third current source 204 includes a transistor 205 and an emitter resistor 206 connected in series.

The base of the third differential transistor 201 is coupled to the collector of the second differential transistor 102 in the first differential amplifier 100 through a resistor 207 and a transistor 208. The base of the fourth differential transistor 202 is coupled to the DC voltage source 26 through a resistor 209 and a transistor 210. The bases of the transistors 201, 202 are further coupled to to the ground terminal E through diodes 211 and 212, respectively, and a fourth current source 213, in common. The second current source 213 includes a transistor 214 and an emitter resistor 215 connected in series. The collector of the fourth differential transistor 202 is connected to the power supply terminal Vcc through a second capacitor 24.

In the third differential amplifier 300, a pair of fifth and sixth transistors 301 and 302 are coupled to each other in a differential amplifier configuration. The collector of the fifth differential transistor 301 is directly coupled to the power supply terminal Vcc. The collector of the sixth differential transistor 302 is coupled to the power supply terminal Vcc through a resistor 32, as described later. Their emitters are connected in common to each other and coupled to a ground terminal E through a fifth current source 303. The fifth current source 303 includes a transistor 304 and an emitter resistor 305 connected in series.

The base of the fifth differential transistor 301 is coupled to the collector of the fourth differential transistor 202 in the second differential amplifier 200 through a transistor 306. The base of the sixth differential transistor 302 is coupled to another DC voltage source 401. The collector of the sixth differential transistor 202 is connected to the first differential amplifier 100 through the first capacitor 22.

The bases of the active load transistors 103 and 203 are coupled to the base of a transistor 402. The collector of the transistor 402 is connected to its base so that the transistor 402 operations as a diode. The transistor 402 is coupled between the power supply terminal Vcc and the ground terminal E through a sixth current source 403. Thus, the transistors 103, 203 and 402 forms a first current mirror circuit. The sixth current source 403 includes a transistor 404 and an emitter resistor 405 connected in series.

The bases of the transistors 105, 205, 304 and 404 in the first, third, fifth and sixth current sources 104, 204, 303 and 403 are coupled to the base of a transistor 406. The collector of the transistor 406 is connected to its base so that the transistor 406 functions as a diode. The collector and emitter of the transistor 406 are coupled to the power supply terminal Vcc and the ground terminal E through a variable resistor 407 and an emitter resistor 408. Thus, the transistors 105, 205, 304, 404 and 406 forms a second current mirror circuit.

The bases of the transistors 113 and 214 in the second and fourth current sources 112 and 213 are coupled to the base of a transistor 409. The collector of the transistor 409 is connected to its base so that the transistor 409 functions as a diode. The collector and emitter of the transistor 409 are coupled to the power supply terminal Vcc and the ground terminal E through a resistor 410 and an emitter resistor 411. Thus, the transistors 113, 214 and 409 forms a third current mirror circuit.

Here the following is assumed. That is, the resistances R107, R109, R207 and R209 of the resistors 107, 109, 207 and 209 have the same value Re. The currents I104 and I204 of the first and third current sources 104 and 204 have the same value Ix. And the currents I112 and I213 of the second and fourth current sources 112 and 213 have the same value Is. Then, the conductances gm100 and gm200 of the first and second differential amplifiers 100 and 200 are expressed as follow:

$$gm100 = gm200 = \frac{1}{2 \cdot Re} \cdot \frac{Ix}{Is} \tag{14}$$

Here, it is assumed that the conductances gm100 and gm200 are equal to conductances gm18 and gm20, respectively.

According to the Equation (14), the conductances gm100 and gm200 can be varied by controlling the current Ix of the current sources 105, 205. The current Ix is controlled by adjusting the variable resistor 407. The oscillation frequency of the circuit varies in accordance with the conductances gm100 and gm200. As a result, the circuit, shown in FIG. 5, operates as a voltage controlled oscillator.

A voltage configuration output Va of the voltage controlled oscillator is obtained from the emitter of the transistor 306. The feed back current Ib is equal to the difference between the collector current of transistor 302 and the current flowing through the resistor 32. The output Va is applied to the base of the fifth differential transistor 301 of the third differential amplifier 300.

The third differential amplifier 300 outputs a current from the collector of the sixth differential transistor 302, in response to the output Va. The current is fed back to the first differential amplifier 100 through the first capacitor 22, as a current configuration input Ib of the voltage controlled oscillator.

Thus, the input Ib and the output Va are expressed as follows:

$$Ib = k \cdot Is \tag{15}$$

$$Va = 2 \cdot Re \cdot \frac{Is}{Ix} \cdot Ib = 2Re \cdot k \cdot Ib; \text{ and} \tag{16}$$

where k is constant.

In the voltage controlled oscillator of FIG. 5, the resistance Re of the resistors 107, 109, 207 and 209, the constant k and the current Is of the current sources 112 and 213 are set in constant. Therefore, the levels of the input Ib and the output Vb, as expressed by the Equations (15), (16), become constant. Accordingly, the voltage controlled oscillator can provide a stable oscillation output, regardless of the resistance of the resistor 32 and the current Ix of the current sources 105, 205.

As described above, the present invention can provide an oscillation circuit which is simple in construction and is capable of driving a band-pass filter satisfactorily without causing a shift of the oscillation frequency.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example for the purposes of a dividual application.

What is claimed is:

1. An isolation circuit for an integrated circuit device, comprising:
   band-pass filter means for producing an output signal having a voltage and a defined resonant frequency; and
   voltage to current converter type limiter amplifier means connected to the band-pass filter means for supplying a current to the band-pass filter means corresponding to the voltage of the output signal of the band-pass filter means; wherein
   said voltage to current converter type limiter amplifier means includes a variable current source for converting the voltage of the output signal to a current; and
   the band-pass filter means includes a pair of voltage to current conversion circuits connected in series, each circuit of the pair including a capacitor, and wherein the variable current source is connected to the capacitor of the first voltage to current conversion circuit for supplying the current to the capacitor.

2. The oscillation circuit of claim 1 wherein the voltage to current converter type limiter amplifier means further includes a resistor connected not only in series to the capacitor of the first voltage to current conversion circuit but also in parallel with the variable current source.

* * * * *